United States Patent
Huang et al.

(10) Patent No.: US 9,349,974 B2
(45) Date of Patent: May 24, 2016

(54) ORGANIC DISPLAY DEVICE AND MANUFACTURING METHOD

(71) Applicant: BOE TECHNOLOGY GROUP CO., LTD., Beijing (CN)

(72) Inventors: Wei Huang, Beijing (CN); Dawei Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 31 days.

(21) Appl. No.: 14/125,792

(22) PCT Filed: Oct. 30, 2012

(86) PCT No.: PCT/CN2012/083733
§ 371 (c)(1),
(2) Date: Dec. 12, 2013

(87) PCT Pub. No.: WO2014/008720
PCT Pub. Date: Jan. 16, 2014

(65) Prior Publication Data
US 2015/0200380 A1    Jul. 16, 2015

(30) Foreign Application Priority Data
Jul. 10, 2012   (CN) .......................... 2012 1 0238436

(51) Int. Cl.
*H01L 51/50* (2006.01)
*H01L 51/56* (2006.01)
(Continued)

(52) U.S. Cl.
CPC ........ *H01L 51/5012* (2013.01); *H01L 51/0003* (2013.01); *H01L 51/5206* (2013.01);
(Continued)

(58) Field of Classification Search
USPC .......................................................... 257/40
See application file for complete search history.

(56) References Cited

U.S. PATENT DOCUMENTS

2005/0052120 A1*  3/2005  Gupta et al. .................. 313/503
2005/0189878 A1   9/2005  Shitagami et al.
(Continued)

FOREIGN PATENT DOCUMENTS

CN    1359253 A    7/2002
CN    1665352 A    9/2005
(Continued)

OTHER PUBLICATIONS

Second Office Action (Chinese language) issued by the State Intellectual Property Office ("SIPO") on Oct. 15, 2014 for International Application No. 201210238436.5, 5 pages.
(Continued)

*Primary Examiner* — Thao P Le
(74) *Attorney, Agent, or Firm* — Ladas & Parry LLP

(57) ABSTRACT

An organic display device and a manufacturing method are disclosed. The organic display device comprises: an organic light-emitting layer (15) located between an anode layer (13) and a cathode layer (14), and the organic light-emitting layer (15) comprises a plurality of pore-walls (16) formed of an organic material and a plurality of pores (17) to be filled with an organic light-emitting material (18). By delimiting the space of an organic light-emitting layer (15) into a plurality of pores (17), with each pore (17) occupying a smaller area of a pixel, the method reduces the inkjet-printing area, and increases the process tolerance of an inkjet-printing process, and further the method makes the inkjet-printing technology less dependent on the pixel size, shape, and other design factors, and thus the freedom degree of position-alignment becomes greater.

9 Claims, 6 Drawing Sheets

(51) Int. Cl.
*H01L 51/00* (2006.01)
*H01L 51/52* (2006.01)

(52) U.S. Cl.
CPC ............ *H01L51/5221* (2013.01); *H01L 51/56* (2013.01); *H01L 51/004* (2013.01); *H01L 51/005* (2013.01); *H01L 51/0035* (2013.01)

(56) References Cited

U.S. PATENT DOCUMENTS

| | | | |
|---|---|---|---|
| 2006/0252337 A1* | 11/2006 | Lambertini et al. | 445/24 |
| 2007/0241326 A1* | 10/2007 | Kim | H01L 51/5275 257/40 |
| 2008/0107823 A1 | 5/2008 | Morri et al. | |
| 2008/0150423 A1 | 6/2008 | Kim et al. | |
| 2010/0079064 A1* | 4/2010 | Kimura et al. | 313/504 |
| 2011/0108880 A1 | 5/2011 | Yanagihara | |
| 2012/0132916 A1* | 5/2012 | Jung | H01L 27/326 257/59 |
| 2013/0228801 A1* | 9/2013 | Lee | H01L 51/5268 257/88 |

FOREIGN PATENT DOCUMENTS

| | | |
|---|---|---|
| CN | 101207150 A | 6/2008 |
| CN | 101447509 A | 6/2009 |

OTHER PUBLICATIONS

English translation of second Office Action issued by SIPO for International Application No. 201210238436.5, 6 pages.
English translation of Chinese Patent No. 1359253, 25pgs.
English translation of Chinese Patent No. 1665352, 19pgs.
English translation of Chinese Patent No. 101207150, 18pgs.
First Office Action issued by the Chinese Patent Office for Chinese Patent Application No. 2012102384365 dated Apr. 30, 2014, 6pgs.
English translation of First Office Action issued by the Chinese Patent Office for Chinese Patent Application No. 2012102384365 dated Apr. 30, 2014, 4pgs.
International Search Report for International Application No. PCT/CN2012/083733, 13pgs.
International Preliminary Report on Patentability for International Application No. PCT/CN2012/083733 dated Jan. 13, 2015, nine (9) pages.
Third Office Action (Chinese language) issued by the State Intellectual Property Office ("SIPO") on Mar. 12, 2015 for International Application No. 201210238436.5, 7 pages.
English translation of Third Office Action issued by SIPO for International Application No. 201210238436.5, 6 pages.
English Language Abstract of CN101447509A; 1 page.

* cited by examiner

ORGANIC DISPLAY DEVICE AND MANUFACTURING METHOD

CROSS REFERENCE TO RELATED APPLICATIONS

This application is based on International Application No. PCT/CN2012/083733 filed on Oct. 30, 2012, which claims priority to Chinese National Application No. 201210238436.5 filed on Jul. 10, 2012, the contents of which are incorporated herein by reference.

TECHNICAL FIELD

Embodiments of the present invention relates to an organic display device and a manufacturing method.

BACKGROUND

An organic light-emitting display (OLED) is different from a conventional liquid crystal display (LCD), it has a self-luminous characteristics without a backlight, and it can employ a very thin organic-material coating layer and a glass substrate. When an electric current flows through an organic-material coating layer, the organic material emits light under the effect of the electric current. An OLED has a larger viewing angle and can significantly save electric energy. These advantages make the OLED technology probably become the mainstream in the field of display devices.

As illustrated in FIG. 1, it is a schematic structural diagram of an organic display panel. The organic display panel comprises: a thin film transistor (TFT) substrate 1, a capping substrate 2, an anode layer 3, a cathode layer 4, an organic light-emitting layer 5 and a separating bank 6. Seen from this sectional view, the organic light-emitting layer 5 is disposed under the cathode layer 4 and above the anode layer 3, with its both sides being confined by the separating bank 6. The separating bank 6 may be manufacture by a photolithography process.

The organic light-emitting layer 5 is filled therein with an organic light-emitting material. One commonly used filling method is inkjet-printing, that is, an inkjet-printer head is used to spray an ink-solution, which is formed of the organic light-emitting material, onto the substrate where the anode is provided. When in operation, the inkjet-printer head performs an inkjet operation according to the position of each pixel in the substrate. However, during the manufacture, such an inkjet process has the following problems.

If the position of the inkjet-printer head is deflected, then the inkjet-printed position will be inaccurate, causing ink-overflow; if the ink volume jetted by the inkjet-printer head is fluctuated, then it will result in non-uniform inkjet-printing, causing that, on the formed organic light-emitting-layer thin film, some places have more sprayed ink, some places have less sprayed ink, and some places have even no sprayed ink. All of these problems will seriously affect the ink distribution on the organic light-emitting-layer thin film, which in turn leads to an unsatisfying luminous effect of the organic light-emitting layer.

In addition, such an organic display panel using a separating bank requires that the organic light-emitting layer is filled with enough ink, so as to ensure full-brightness display of the organic light-emitting layer. As illustrated in FIG. 2, it is a plan view of a conventional organic display panel using a separating bank. Thus, all the positions for forming an organic light-emitting layer need to be sprayed with ink; however, this is prone to causing excessive ink printing, which probably causes ink-solution overflow and affects the ink distribution on the organic light-emitting layer.

As seen from the above, in the prior art, the organic display panel using a separating bank has the problem that the organic light-emitting-layer thin film has an unsatisfying luminous effect.

SUMMARY

Embodiments of the present invention provide an organic display device and a manufacturing method, for solving the problem in the prior art that the organic display panel using a separating bank has an unsatisfying luminous effect of the organic light emitting layer thin film.

In one aspect, the present invention provides an organic display device, which comprises: an anode layer, a cathode layer, and an organic light-emitting layer located between the anode layer and the cathode layer. The organic light-emitting layer comprises a plurality of pore-walls formed of an organic material and a plurality of pores to be filled with an organic light-emitting material, and two adjacent pores are delimited by the pore-wall.

In another aspect, the present invention provides a method of manufacturing an organic display device, which comprises: between the anode layer and the cathode layer, forming an organic light-emitting layer with a porous structure by a process, wherein the organic light-emitting layer comprises a plurality of pore-walls formed of an organic material and a plurality of pores, of which two adjacent pores being delimited by the pore-wall; and filling an organic light-emitting material into the pores.

In the embodiment of the present invention, by using an organic material to delimit the space of an organic light-emitting layer into a plurality of pores, with each pore occupying a smaller area of a pixel, the inkjet-printing area is reduced, and in turn the process tolerance of an inkjet-printing process is increased; in addition, the embodiment of the present invention makes the inkjet-printing technology less dependent on the pixel size, shape, and other design factors, and thus the freedom degree of position-alignment becomes greater, thereby avoiding the problem of an unsatisfying luminous display effect of the organic light-emitting-layer thin film due to uneven inkjet-printing.

BRIEF DESCRIPTION OF THE DRAWINGS

In order to clearly illustrate the technical solutions of the embodiments of the invention, the drawings of the embodiments will be briefly described in the following; it is obvious that the described drawings are only related to some embodiments of the invention and thus are not limitative of the invention.

DETAILED DESCRIPTION OF THE PREFERRED EMBODIMENTS

Figure 1:
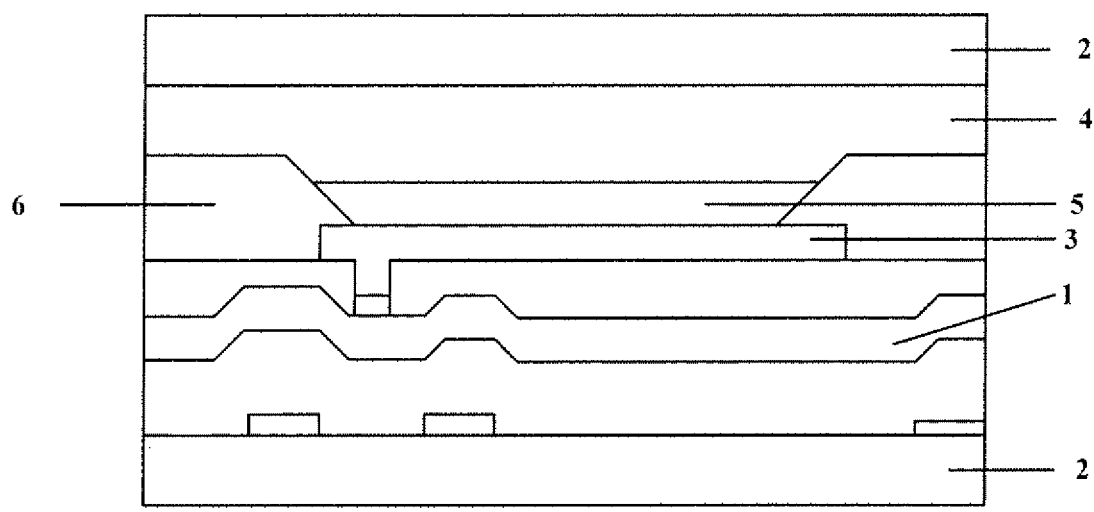
FIG. 1 is a schematic structural diagram of an organic display panel.
Figure 2:
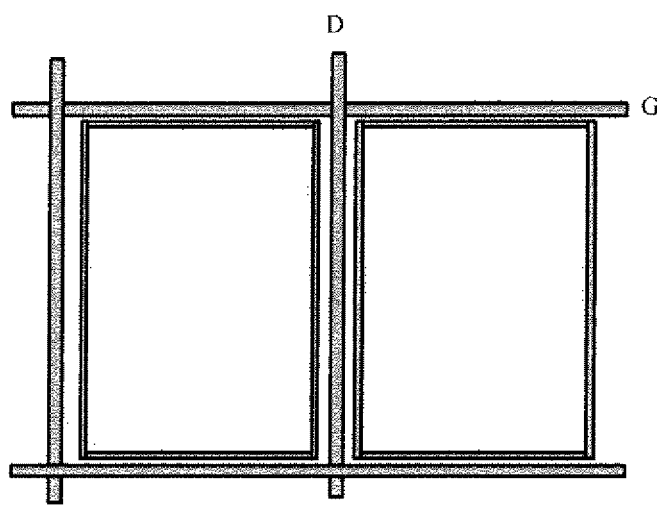
FIG. 2 is a plan view of a conventional organic display panel using a separating bank.

In order to make objects, technical details and advantages of the embodiments of the invention apparent, the technical solutions of the embodiments will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, technical or scientific terms used herein should be interpreted in the usual sense as understood by those ordinary skilled in the relevant art of the present invention. The terms "first", "second", and the like, used in the specification and claims of this patent application of the invention, do not denote any order, quantity, or importance, but are used to distinguish among different integral parts. Similarly, the words "a", "an" and the like, herein do not denote a limitation of quantity, but denote the presence of at least one of the referenced item. The terms "connect", "couple" or the like, are not limited to physical or mechanical connections, but may comprise electrical connection, whether direct or indirect. The terms "on", "under", "left", "right" or the like are only used to indicate a relative positional relationship, which may be changed along with a change in an absolute position of a described object.

An embodiment of the present invention provides an organic display device and a manufacturing method thereof; the organic display device comprises: a first substrate, a second substrate, an anode layer located on one of the first substrate and the second substrate, a cathode layer located on the other of the first substrate and the second substrate, and an organic light-emitting layer located between the anode layer and the cathode layer.

The organic light-emitting layer comprises: a plurality of pore-walls formed of an organic material, and a plurality of pores to be filled with an organic light-emitting material. Because the organic material is used to delimit the space of the organic light-emitting layer into a plurality of pores, with each pore occupying a smaller area of a pixel, the inkjet-printing area is reduced, and in turn the process tolerance of an inkjet-printing process is increased. In addition, the embodiment makes the inkjet-printing technology less dependent on the pixel size, shape, and other design factors, and thus the freedom degree of position-alignment becomes greater, thereby avoiding the problem of an unsatisfying luminous display effect of the organic light-emitting-layer thin film due to uneven inkjet-printing.

The organic display device comprises a plurality of pixels, and these pixels are arranged in a certain array and mutually separated by a separating bank, for example. The organic display device comprises, for example, red, green and blue pixels for color display.

First Embodiment

Figure 3:
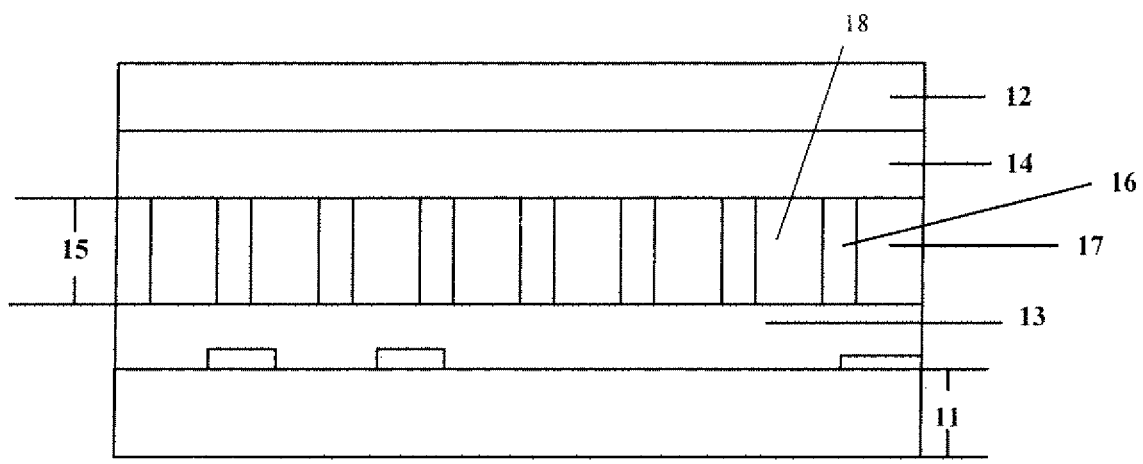
FIG. 3 is a schematic structural diagram of the organic display device of a first embodiment.

FIG. 3 is a schematic structural diagram of the organic display device of the first embodiment of the present invention. The organic display device comprises: a first substrate 11, a second substrate 12, an anode layer 13 located on one of the first substrate and the second substrate, a cathode layer 14 located on the other of the first substrate and the second substrate, and an organic light-emitting layer 15 located between the anode layer and the cathode layer. The organic light-emitting layer 15 comprises: a plurality of pore-walls 16 formed of an organic material, and a plurality of through-hole pores 17 to be filled with an organic light-emitting material 18.

The first substrate 11 and the second substrate 12 may respectively comprise one or more selected from an array substrate and a capping substrate. An array substrate is, for example, a thin-film transistor (TFT) substrate, that is, in which each pixel uses a thin-film transistor as a switching element.

Assuming that the anode layer 13 is located on the first substrate 11, then the cathode layer 14 will be located on the second substrate 12; or, it is also possible that the cathode layer is located on the first substrate 11, whereas the anode layer is located on the second substrate 12. In another way, a laminate of the cathode layer, the light-emitting layer and the anode layer, for example, may be formed on only one substrate, for example, on the first substrate.

Between the cathode layer 14 and the anode layer 13, there is provided the organic light-emitting layer 15; the organic light-emitting layer 15 comprises the plurality of pore-walls 16 formed of an organic material, and the plurality of pores 17 to be filled with an organic light-emitting material 18. Between two adjacent pores 17, there is the pore-wall 16, that is, the adjacent pores 17 are delimited by the pore-walls 16.

The organic material for constructing the pore-walls includes, for example, one or more selected from polymethacrylates, acrylate, and polycarbonate.

For example, the pore-walls 16 formed of the organic material may be manufactured by means of transfer-printing, micromachining, UV/thermal curing, etc.

For example, the thickness of the pore-wall 16 formed of the organic material between two adjacent pores 17 is 30~150 nm. Preferably, the thickness of the pore-wall 16 formed of the organic material between two adjacent pores 17 is 60~120 nm.

The height of the pore-walls 16 formed of the porous material is equal to the distance between the cathode layer 14 and the anode layer 12, and thus the pore-walls 16 define the height of the organic light-emitting layer 15.

For example, the dimension of the inner-diameter of the pores 17 to be filled with the organic light-emitting material 18 is 2 μm~5 μm. For example, the pores 17 may be in the shape of a circle, then the dimension of the inner-diameter of the pores 17 filled with the organic light-emitting material is the dimension of the circle's diameter, i.e., the dimension of the circle's diameter is 2 μm~5 μm; the pores also may be in a geometry shape, and if the pores are in the shape of a square, then the dimension of the inner-diameter of the pores 17 filled with the organic light-emitting material 18 is the dimension of the square's diagonal, i.e., the dimension of the square's diagonal is 2 μm~5 μm.

It should be noted, the shape of each pore may be the same, and also may be different, which may be determined according to actual needs.

The organic light-emitting material 18 may be, for example, any suitable organic light-emitting material, including but not limited to, a materials emitting red, green or blue light, and also may be a phosphorescent light-emitting material or a fluorescent light-emitting material.

It should be noted, in order to more effectively transfer carriers (electrons and holes) between the cathode or the anode and the organic light-emitting layer 15, there may be also comprised an additional functional layer between the organic light-emitting layer 15 and the cathode layer 14 or the anode layer 12, such as one or more layers selected from a hole-injection layer, a hole-transport layer, a light-emitting layer, an electron-transport layer and an electron-injection layer.

That is, if one pore that is sprayed with the organic light-emitting material and its surrounding pore-walls are regarded as an organic light-emitting sub-unit, then the organic light-emitting sub-unit owns one or more layers from the above-mentioned five layers.

Each organic light-emitting sub-unit is regarded as a display region. In this display region, a voltage is applied between the cathode layer and the anode layer, so that the generated electrons and holes are injected respectively from the cathode layer and the anode layer into the electron-injection layer and the hole-injection layer, and passing through the electron-transport layer and the hole-transport layer, the electrons and holes meet in the light-emitting layer and recombine to form excitons, causing the molecules of the light-emitting layer to be excited to emit light, and thus the display region is properly lit up. Outside that display region and in the display regions of other pores, the display regions will not be lit up if the luminous condition is not met. The display region that can be lit-up will not affected by the display region that cannot be lit-up. Therefore, during the whole manufacturing process of the organic display device, the freedom degree of spraying the organic light-emitting material is increased, and it avoids such a problem that the entire organic light-emitting layer can not emit light because of some places being not jet-printed.

Figure 4:
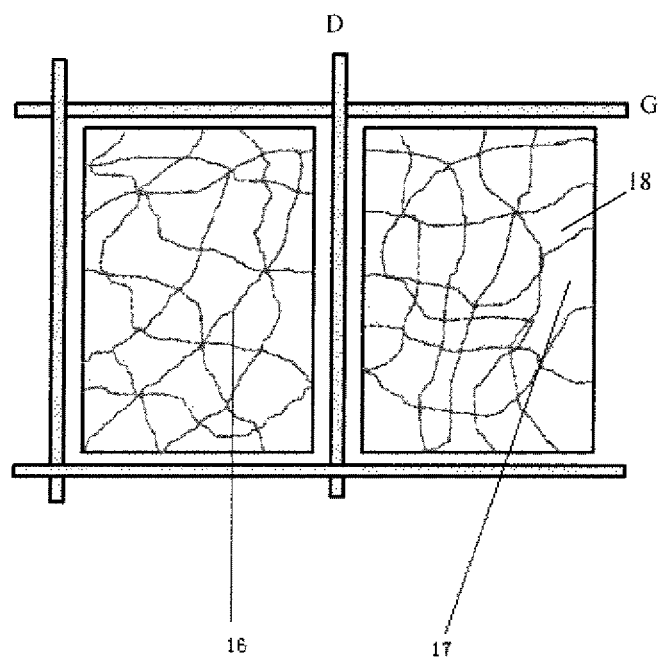
FIG. 4 is a plan view of the organic display device of the present invention.

FIG. 4 is a plan view of the organic display device of this embodiment. As illustrated in the drawing, the organic display device comprises: a plurality of pixels P, for example, defined by gate lines G and data lines D crossing one another; and the plurality of pixels P are separated mutually, for example, by a separating bank (not illustrated). The organic display device may further comprise, for example, driving lines parallel to the data lines D. As illustrated in FIG. 4, the veining lines in each pixel are the pore-walls 16 formed of a porous material, and these veining lines define the plurality of pores 17, the pores 17 being filled with the organic light-emitting material 18; as can be seen, the pore-walls 16 formed of the porous material become the separating banks of the display region formed by each pore, i.e., form a plurality of micro separating banks, thereby reducing the requirements for the positions of the inkjet-printing points and the inkjet-printing shapes, so that the freedom degree of the display of the entire organic light-emitting layer is increased, and the problem of an unsatisfying luminous display effect of the organic light-emitting-layer thin film due to uneven inkjet-printing can be avoided.

It should be noted, the organic display device of this embodiment is applicable to a top-emission type display device, and applicable to a bottom-emission type display device as well. However, when the organic light-emitting layer structure of this embodiment is applied to a bottom-emission type display device, the manufacturing methods are subject to certain restrictions, and are not appropriate to use the processes of transfer-printing and micromachining.

With the solution of the first embodiment, by using a porous material to delimit the space of an organic light-emitting layer into a plurality of pores, with each pore occupying a smaller area of a pixel, the inkjet-printing area is reduced, and in turn the process tolerance of an inkjet-printing process is increased; thus, the inkjet-printing technology is less dependent on the pixel size, shape, and other design factors, so that the freedom degree of position-alignment becomes greater, thereby avoiding the problem of an unsatisfying luminous display effect of the organic light-emitting-layer thin film due to uneven inkjet-printing.

Second Embodiment

This embodiment provides a method of manufacturing an organic display device, comprising the steps as follows:

First step: between an anode layer and a cathode layer, an organic light-emitting layer with a porous structure is formed by a process, the organic light-emitting layer comprises a plurality of pore-walls formed of an organic material and a plurality of pores, and two adjacent pores are delimited by the pore-wall.

Second step: an organic light-emitting material is filled into the pores.

The number and volume of the organic light-emitting material filling can be determined according to the actual needs; after completion of the filling process, except the organic light-emitting layer, other layers are manufactured in the same way as the prior art, which is not repeated here for simplicity.

Figure 5:
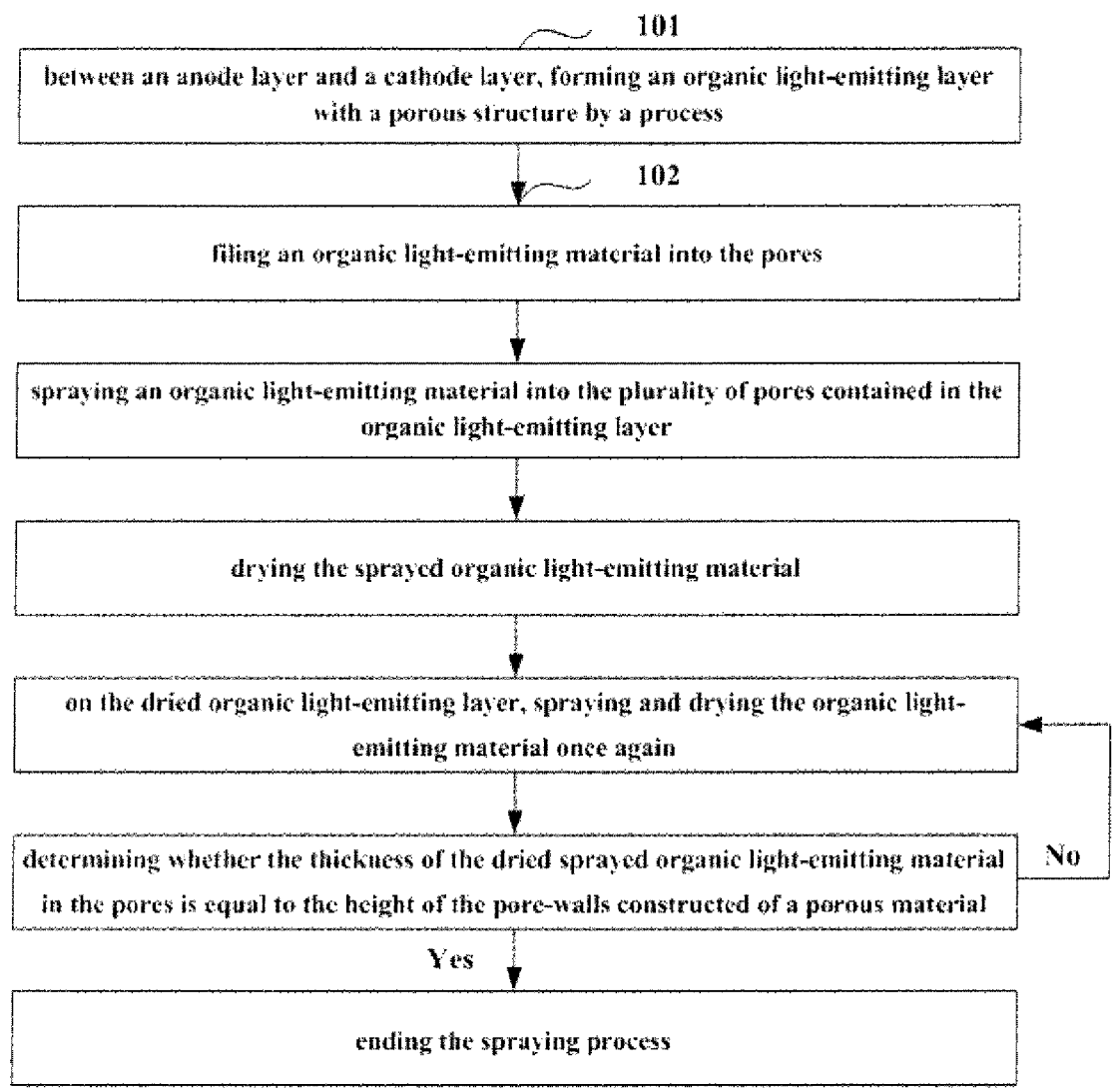
FIG. 5 is a flowchart of the method of manufacturing an organic display device, provided by a second embodiment.

FIG. 5 is a flowchart showing an exemplary method of manufacturing an organic display device provided by the second embodiment of the invention. The method of manufacturing an organic display device comprises, for example, the steps as follows.

Step 101: between an anode layer and a cathode layer, forming an organic light-emitting layer with a porous structure by a process.

The organic light-emitting layer comprises a plurality of pore-walls formed of an organic material and a plurality of pores, and two adjacent pores are delimited by the pore-wall.

For example, the height of the pore-walls formed of the organic material is equal to the distance between the cathode layer and the anode layer.

Figure 6:
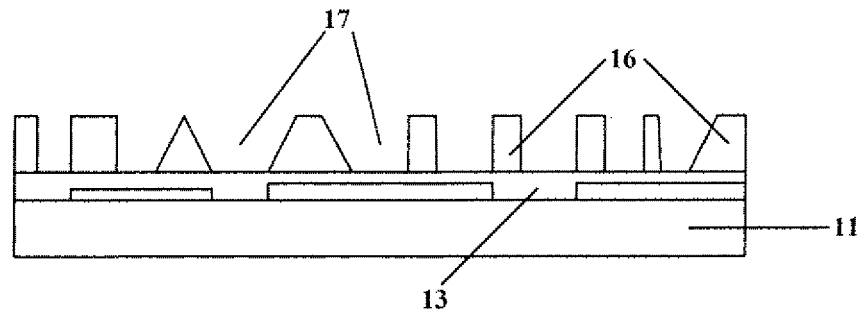
FIG. 6 is a schematic diagram illustrating a process of forming a plurality of pore-walls on the anode on one side of a substrate.

Prior to Step 101, an anode/or cathode material is firstly coated on a first substrate 11 to form an anode layer 13/or cathode layer 14; on the anode layer 13/or cathode layer 14, by using a porous material to form a plurality of pore-walls 16, with a plurality of pores 17 being formed among the pore-walls, as illustrated in FIG. 6.

Step 102: filing an organic light-emitting material into the pores.

In Step 102, the process of filling an organic light-emitting material into the pores comprises, for example, the steps as follows.

First step: spraying an organic light-emitting material into the plurality of pores contained in the organic light-emitting layer.

In this step, the approaches of spraying an organic light-emitting material into the plurality of pores contained in the organic light-emitting layer are not limited to the inkjet-printing technology, but may also use other ways for solutions to spray the organic light-emitting material, which is not specifically limited here.

Figure 7:
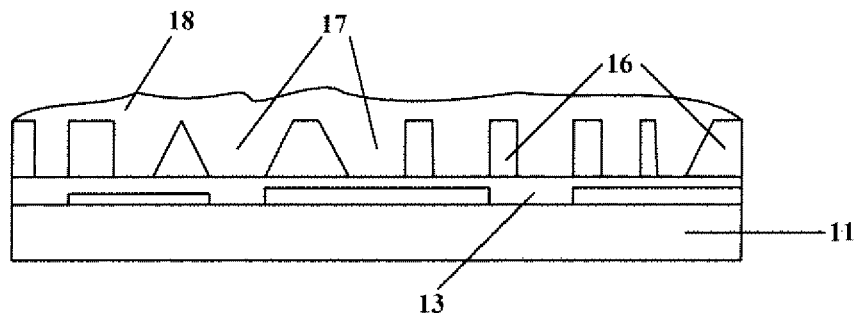
FIG. 7 is a schematic diagram illustrating a process of spraying an organic light-emitting material into a plurality of pores contained in the organic light-emitting layer.

FIG. 7 is a schematic diagram illustrating a process of spraying an organic light-emitting material 18 into the plurality of pores contained in the organic light-emitting layer 15.

Second step: drying the sprayed organic light-emitting material.

Figure 8:
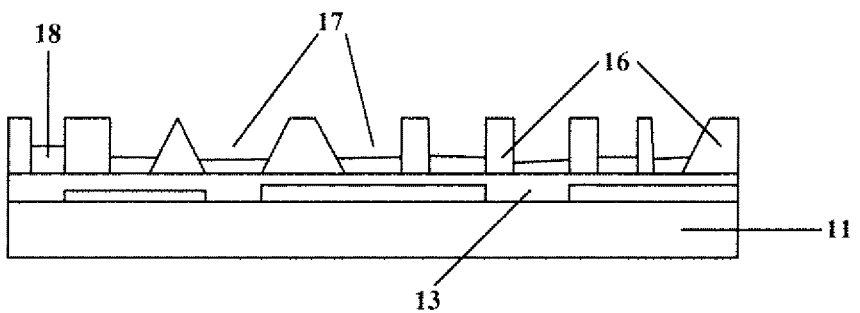
FIG. 8 is a schematic diagram illustrating the dried organic light-emitting layer.

FIG. 8 is a schematic diagram illustrating the dried organic light-emitting layer.

Third step: on the dried organic light-emitting layer, spraying and drying the organic light-emitting material once again.

Figure 9:
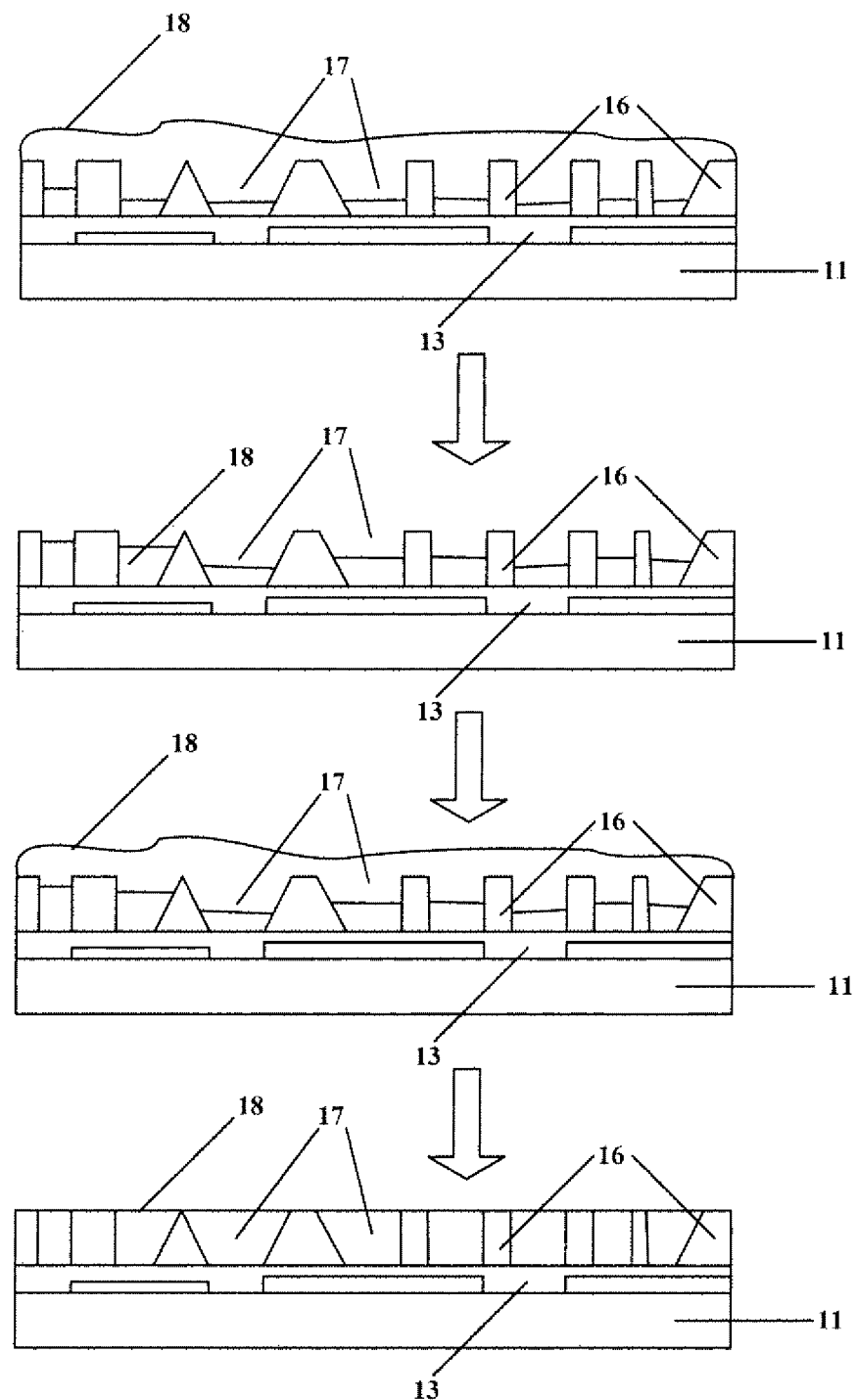
FIG. 9 is a schematic diagram illustrating the once again sprayed and dried organic light-emitting material.

FIG. 9 is a schematic diagram illustrating the once again sprayed and dried organic light-emitting material.

Fourth step: determining whether the thickness of the dried sprayed organic light-emitting material in the pores is equal to the height of the pore-walls constructed of a porous material, and if it is equal, then ending the spraying process; if it is not equal, then proceeding with the inkjet-printing process until the thickness of the dried sprayed organic light-emitting material in the pores is equal to the height of the pore-walls constructed of the porous material.

Figure 10:
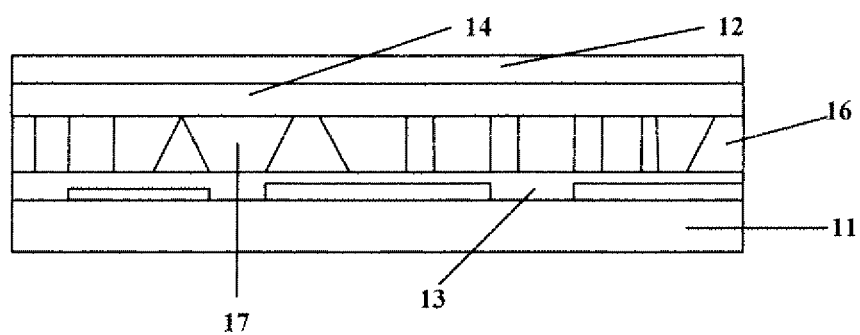
FIG. 10 is a schematic diagram illustrating that the thickness of the dried sprayed organic light-emitting material is equal to the height of the pore-walls constructed of a porous material.

FIG. 10 is a schematic diagram illustrating that the thickness of the dried sprayed organic light-emitting material is equal to the height of the pore-walls constructed of a porous material.

The number of times of spraying the organic light-emitting material is at least twice.

It should be noted, when one or more layers selected from a hole-injection layer, a hole-transport layer, an electron-transport layer and an electron-injection layer are incorporated between the anode layer or cathode layer and the organic light-emitting layer, the manufacturing method for them may be the same as the prior art, which is not repeated here; and in this case, the height of the pore-walls is just the distance between the two layers adjacent to the organic light-emitting layer.

Further, the number of times of filling the organic light-emitting material and the height of the organic light-emitting material, may be selected and determined according to requirements and actual processing conditions, which is not specifically limited here; for example, the filling height of the organic light-emitting material is equal to the height of the pore-walls of the organic light-emitting layer; for example, the number of times of filling the organic light-emitting material is at least twice.

The above are merely exemplary implementations of the present invention, but not for limiting the scope of the invention; instead, the scope of the invention should be defined by the appended claims.

The invention claimed is:

1. An organic display device, comprising:
 a plurality of pixels and a separating bank, wherein the pixels are mutually separated by the separating bank, and each pixel comprises: an anode layer, a cathode layer, and an organic light-emitting layer located between the anode layer and the cathode layer, wherein the organic light-emitting layer comprises: a plurality of pore-walls formed of an organic material, and a plurality of pores to be filled with an organic light-emitting material, of which two adjacent pores being delimited by the pore-wall.

2. The organic display device according to claim 1, wherein a thickness of the pore-wall formed of the organic material between two adjacent pores is 30~150 nm.

3. The organic display device according to claim 1 wherein a height of the pore-walls formed of the organic material is equal to a distance between the cathode layer and the anode layer.

4. The organic display device according to claim 1, wherein a dimension of the inner-diameter of the pores filled with the organic light-emitting material is 10 nm~20 μm.

5. The organic display device according to claim 1, wherein a dimension of the inner-diameter of the pores filled with the organic light-emitting material is 2 μm~5 μm.

6. The organic display device according to claim 3, wherein the organic material includes one or more selected from polymethacrylates, acrylate, and polycarbonate.

7. A method of manufacturing an organic display device, comprising:
 forming a separating bank to divide the organic display device into a plurality of pixels that are mutually separated, between the anode layer and the cathode layer of each pixel, forming an organic light-emitting layer with a porous structure by a process, wherein the organic light-emitting layer comprises a plurality of pore-walls formed of an organic material and a plurality of pores, of which two adjacent pores being delimited by the pore-wall; and
 filling an organic light-emitting material into the pores.

8. The method according to claim 7, wherein filling an organic light-emitting material into the pores comprises:
 spraying an organic light-emitting material into the plurality of pores contained in the organic light-emitting layer;
 drying the sprayed organic light-emitting material, and
 determining whether the thickness of the dried sprayed organic light-emitting material in the pores is equal to the height of the pore-walls constructed of a porous material, if it is not equal, proceeding with the spraying operation, until the thickness of the dried sprayed organic light-emitting material in the pores is equal to the height of the pore-walls constructed of the porous material.

9. The method according to claim 8, wherein the number of times of spraying the organic light-emitting material is at least twice.

\* \* \* \* \*